(12) United States Patent
Tang

(10) Patent No.: US 7,358,753 B2
(45) Date of Patent: Apr. 15, 2008

(54) PROBING APPARATUS, PROBING CIRCUIT BOARD AND PROBING SYSTEM FOR HIGH-VOLTAGE MATRIX PROBING

(75) Inventor: Li-Jen Tang, Hsinchu County (TW)

(73) Assignee: IP Leader Technology Corp., Taichung County (TW)

( * ) Notice: Subject to any disclaimer, the term of this patent is extended or adjusted under 35 U.S.C. 154(b) by 10 days.

(21) Appl. No.: 11/535,949

(22) Filed: Sep. 27, 2006

(65) Prior Publication Data

US 2007/0126438 A1   Jun. 7, 2007

(30) Foreign Application Priority Data

Nov. 30, 2005   (TW) .............................. 94142098 A

(51) Int. Cl.
*G01R 31/02* (2006.01)
(52) U.S. Cl. ...................................... 324/754; 324/537
(58) Field of Classification Search ...................... None
See application file for complete search history.

(56) References Cited

U.S. PATENT DOCUMENTS

| | | | |
|---|---|---|---|
| 4,714,875 A * | 12/1987 | Bailey et al. .............. 327/73.1 |
| 4,743,847 A | 5/1988 | Frushour | |
| 4,746,855 A * | 5/1988 | Wrinn ......................... 324/763 |
| 4,769,596 A * | 9/1988 | Faucett ....................... 324/557 |
| 5,101,151 A | 3/1992 | Beaufils et al. | |
| 5,485,094 A * | 1/1996 | Endoh et al. ............... 324/537 |
| 5,570,027 A * | 10/1996 | Stans et al. ................. 324/523 |
| 5,744,964 A * | 4/1998 | Sudo et al. ................. 324/537 |
| 6,300,786 B1 * | 10/2001 | Doherty et al. ............. 324/765 |
| 6,525,526 B1 * | 2/2003 | De Gruyter et al. ..... 324/158.1 |
| 6,696,707 B2 | 2/2004 | Polce et al. | |
| 6,824,243 B2 | 11/2004 | Yamaguchi et al. | |
| 6,849,491 B2 | 2/2005 | Martel et al. | |

\* cited by examiner

*Primary Examiner*—Ha Tran Nguyen
*Assistant Examiner*—Trung Q. Nguyen
(74) *Attorney, Agent, or Firm*—Patterson, Thuente, Skaar & Christensen, P.A.

(57) ABSTRACT

A probing apparatus, probing circuit board and probing system for high-voltage matrix probing are provided. Switching circuits of the probing apparatus capable of probing a plurality of probing points for high-voltage matrix probing are manufactured with using a mixed high-voltage IC process. The probing circuit board comprises a plurality of probing apparatuses integrated on a bare circuit board. The probing system comprises a plurality of probing circuit boards integrated in a machine.

32 Claims, 10 Drawing Sheets

PROBING APPARATUS, PROBING CIRCUIT BOARD AND PROBING SYSTEM FOR HIGH-VOLTAGE MATRIX PROBING

This application claims priority to Taiwan Patent Application No. 094142098 filed on Nov. 30, 2005.

CROSS-REFERENCES TO RELATED APPLICATIONS

Not applicable.

BACKGROUND OF THE INVENTION

1. Field of the Invention

The present invention relates to probing apparatuses, probing circuit boards, and probing systems for high-voltage matrix probing; specifically to probing apparatuses, probing circuit boards, and probing systems that comprise a switching circuit, manufactured with a mixed high-voltage IC process, having the capability of probing a plurality of probe points.

2. Descriptions of the Related Art

In the manufacturing processes of various bare printed circuit board (PCB) products, such as PCBs or integrated circuit carrier boards, the conducting materials used in bare PCBs may not form the desired geometric shapes due to external factors, such as manufacturing techniques and operating environments. This probably leads to serious errors, such as a short circuit and a breakage circuit of the bare PCBs. If components are soldered on these defected bare PCBs, a great loss would be caused in a manufacturing process. Consequently, electrical tests including a short circuit test and a breakage circuit test should be performed to eliminate defects during the production of bare PCBs in order to improve the yield rate of delivered bare circuit boards so that the cost may be reduced.

Electrical tests of PCBs are usually done by test systems. Currently, these test systems for bare PCBs are classified into dedicated test systems, universal test systems and flying-probe test systems. The cost of a dedicated test system is lowest among them, but it requires longer manufacturing time and higher cost of test fixtures. The cost of a universal test system is higher than that of a dedicated test system, and it requires shorter manufacturing time and a lower cost of the test fixtures. Finally, the cost of a flying-probe test system is highest, and it requires no test fixture and has larger test areas. However, most flying-probe test systems hardly avoid a problem of significantly slow test speed.

For universal test systems, matrix probing is popular in the field of electrical test. The common way is to implement a matrix as a bed-of-nails as shown in FIG. 1A, which is a diagram of a single-density probe matrix of the prior art. Each circle in the figure represents a probe point, which usually connects with the conducting material of a bare PCB under test through a conductor for testing (such as a metal probing nail, a conducting rubber, etc.). A distance between two adjacent probe points is 100 mil (1 mil=0.00254 mm) as illustrated in FIG. 1A. Currently, a density of a probe matrix of the prior art can be one of a double-density probe matrix as shown in FIG. 1B, a quad-density probe matrix as shown in FIG. 1C, a octuple-density probe matrix as shown in FIG. 1D and a hexadecuple-density probe matrix as shown in FIG. 1E. The distance between two adjacent probe points is also marked in each figure. In the figures, probe points that are added to increase the density are represented in different patterns for better identification. In recent years, both the required density for probing and the relative number of probe points increase significantly.

Matrix probing requires a switching circuit to control the conductivity of each probe point. In general, each probe point is connected with two switch elements (such as bipolar transistors or field-effect transistors (FETs)) and each switch element is controlled by a switching circuit controller. FIG. 2 is a schematic diagram of a switching circuit of a bipolar transistor matrix of the prior art. The switching circuit comprises a plurality of PNP bipolar transistors 20, a plurality of probe points 21, a plurality of NPN bipolar transistors 22, a test signal input port 23, a switching circuit controller 24, a probing result output port 25, and a plurality of resistors 26. The plurality of PNP bipolar transistors 20 comprise a first PNP bipolar transistor 200, a second PNP bipolar transistor 201, a third PNP bipolar transistor 202, and a fourth PNP bipolar transistor 203. Each of the PNP bipolar transistors 200-203 comprises a base, an emitter, and a collector. The plurality of probe points 21 comprise a first probe point 210, a second probe point 211, a third probe point 212, and a fourth probe point 213 for electrically connecting with an external object under test (not shown). The plurality of NPN bipolar transistors 22 comprise a first NPN bipolar transistor 220, a second NPN bipolar transistor 221, a third NPN bipolar transistor 222, and a fourth NPN bipolar transistor 223. Each of the NPN bipolar transistors 220-223 comprises a base, an emitter, and a collector. The plurality of probe points 21 connect with the collectors of the first PNP bipolar transistor 200, the second PNP bipolar transistor 201, the third PNP bipolar transistor 202, and the fourth PNP bipolar transistor 203, respectively. Furthermore, the plurality of probe points 21 also connects with the collectors of the first NPN bipolar transistor 220, the second NPN bipolar transistor 221, the third NPN bipolar transistor 222, and the fourth NPN bipolar transistor 223, respectively. The switching circuit controller 24 comprises a first switching circuit controller 240 and a second switching circuit controller 241 and connects with the bases of the plurality of PNP bipolar transistors 20 and the bases of the plurality of NPN bipolar transistors 22 through one of the corresponding resistors 26 respectively to control on/off of the bipolar transistors 200-203 and 220-223. During the test process, a test signal is generated by an external test signal generation unit (not shown) and is then delivered to the emitters of all of the bipolar transistors 200-203 through the test signal input port 23. The first switching circuit controller 240 is used for controlling the connectivity of the bipolar transistors 200-203 so that the test signal inputted from the test signal input port 23 can be determined to be delivered to the corresponding plurality of probe points 21. The second switching circuit controller 241 selects at least one of the plurality of NPN bipolar transistors 22 to let a signal value from the corresponding the probe point pass its emitter and transmit to the probing result output port 25. Consequently, a probing result can be transmitted to an external verification unit (not shown) to determine whether a conductance of the object under test is as expected or not.

Here is an example to explain how to determine whether the object under test is conducted or not. Assume that the object under test has a metal conductor (not shown) connected between the first probe point 210 and the third probe point 212. To realize whether the metal conductor is actually conducted or not, a test can be done by turning on the first PNP bipolar transistor 200 through the first switching circuit controller 240 so that the test signal can be transmitted to the first probe point 210. At this time, the test signal is transmitted to the third probe point 212 through the metal conductor of the object under test. The second switching circuit controller 241 then turns on the third NPN bipolar transistor 222 to transmit a signal value from the third probe point 212 to the probing result output port 25. The external verification unit verifies the signal value. Assume that the test signal is a low-voltage signal from several volts to several tens volts and a resistance of the probe point is zero ohm. If the metal conductor of the object under test is conducted, the external verification unit should be able to measure a voltage value after a voltage drop on an equivalent resistance of the first PNP bipolar transistor 200, the metal conductor and the third NPN bipolar transistor 222. If the resistance of the metal conductor is too high due to, for example, manufacturing defects, the measured voltage value would be too low. In order to exclude defective parts of bare PCBs effectively, a standard can be established to determine whether a conductance condition of the metal conductor meets the standard of the manufacture of bare PCBs.

A test signal with a high voltage, such as 300 volts, is usually applied under the above-mentioned test. The high voltage is generated externally and inputted through the test signal input port 23. The bipolar transistors that correspond to unconducted probe points of the object under test are conducted through the switching circuit 24. The probing result of the probing result output port 25 is then measured by the external verification unit to determine whether acceptable isolation can be achieved between probe points that have no conductance. If some residues of the metal conductor unexpectedly connect probe points that should not be conducted due to manufacturing defects, a measured resistance would be too low and thus the defective condition can be verified.

FIG. 3 is a diagram of another switching circuit which comprises field-effect-transistors. The testing principle and method are similar to those shown in FIG. 2 and not described here.

In recent years, many mixed high-voltage IC processes, such as a BCD (Bipolar-CMOS-DMOS) process, a CD (CMOS-DMOS) process, and a BiCMOS (Bipolar-CMOS) process have been developed by many IC manufacturers. One of the features of these IC processes is to integrate a traditional low-voltage IC process (e.g. a CMOS process with a common operating voltage of 5 volts or below) and a medium-high voltage IC process (e.g. a series of processes of bipolar transistors or DMOS (Double-Diffused MOS) with a common operating voltage of several tens to approximately one thousand volts) into a single manufacturing process. Currently, many power component manufacturers, vehicle electronics manufacturers, and TFT LCD manufacturers adopt a mixed high-voltage IC process technique to develop new products that mix both CMOS and LDMOS (Lateral DMOS) or mix both CMOS and VDMOS (Vertical DMOS). These new products have the advantages of reducing packaging costs, reducing power consumptions and enhancing system performance.

In conclusion, in high-voltage matrix probing applications, since switch elements that support high voltages are required, low-voltage switching circuit controllers should be separated from high-voltage switch elements. This makes the bare PCBs of the switching circuits contain fewer circuits so that the probing density is limited. In addition to the problem of a larger area required, other problems include the number of control pins of the switching circuit is increased to control high-voltage switch elements. An example is shown in FIG. 2, wherein four probe points require eight switch elements and eight base control pins. That is, every probe point requires a pair of high-voltage switch elements and a pair of base control pins. Assuming that a SOT-23 package for the high-voltage switch elements is used, a probing system with two hundred thousand probe points in a common double-density matrix requires four hundred thousand high-voltage switch elements. Four hundred thousand base current-limiting resistors are also required. For the switching circuit controllers, four hundred thousand base control pins are required. Considering a PQ100 chip package, each chip has approximately 64 base control pins, excluding pins of the power and other control signals. Four hundred thousand base control pins requires 6,250 chips. If the size of a probing PCB is 28 cm×12 cm=336 cm$^2$, required areas for the probing system are roughly calculated as Table 1 shows.

TABLE 1

| Type of Components | Unit Area (mm$^2$) | Required Number | Total Area (cm$^2$) | Equivalent Number of Probing PCB |
|---|---|---|---|---|
| high-voltage switching element | 8.9 | 400,000 | 35,600 | 106.0 |
| 0805 chip film resistor | 4.5 | 400,000 | 18,000 | 53.6 |
| switching circuit controller chip | 910.0 | 6,250 | 56,875 | 169.3 |
| Total | | | 110,499 | 328.9 |

Table 1 shows an amazing number of the probing PCBs required for the probing system. Furthermore, the calculation does not evaluate required areas for routing and other components (such as bypass capacitors, connectors and regulators, etc.). When the probing density reaches to a hexadecuple-density, the required number of probe points for the same probing area increases to approximately six times.

SUMMARY OF THE INVENTION

An object of this invention is to provide a probing apparatus for high-voltage matrix probing. The probing apparatus, electrically connected with a plurality of probe points and a plurality of interface signals, receives a test signal and generates a probing result. The probing apparatus comprises a plurality of probing pins, a command decoding unit, a plurality of transmission switch elements, and a plurality of receiving switch elements. The command decoding unit, the plurality of transmission switch elements, and the plurality of receiving switch elements are manufactured with the mixed high-voltage IC process. The plurality of probing pins are electrically connected with the plurality of probe points. The command decoding unit is electrically connected with the plurality of interface signals and controls on/off statuses of the plurality of transmission switch elements and/or the plurality of receiving switch elements. The plurality of transmission switch elements transmit the test signal to the corresponding probing pins in response to the command decoding unit. The plurality of receiving switch elements generate the probing result corresponding to the corresponding probing pins in response to the command decoding unit.

Another object of this invention is to provide a probing circuit board for high-voltage matrix probing. The probing circuit board, electrically connected with a plurality of probe points and a plurality of interface signals, receives a test signal and generates a probing result. The probing circuit board comprises a bare PCB, a connection unit mounted on the bare PCB, and a plurality of probing apparatuses mounted on the bare PCB. Each of the probing apparatuses comprises a plurality of probing pins, a command decoding unit, a plurality of transmission switch elements, and a plurality of receiving switch elements. The connection unit electrically connects the plurality of probe points and the plurality of interface signals with the plurality of probing apparatuses. The plurality of probing pins is electrically connected with the connection unit. The command decoding unit is manufactured with a mixed high-voltage IC process, is electrically connected with the plurality of interface signals, and controls on/off statuses of the plurality of transmission switch elements and/or the plurality of receiving switch elements. The plurality of transmission switch elements are manufactured with the mixed high-voltage IC process and transmit the test signal to the corresponding probing pins in response to the control of the command decoding unit. The plurality of receiving switch elements are manufactured with the mixed high-voltage IC process and generate the probing result corresponding to the plurality of probing pins in response to the control of the command decoding unit.

Yet a further object of this invention is to provide a probing system for high-voltage matrix probing. The probing system probes an electrically connected object with a test signal and generates a probing result. The probing system comprises a plurality of probe points electrically connected with the object; a control unit for generating a plurality of interface signals and receiving the probing result; and a plurality of probing circuit boards. Each of the probing circuit boards comprises a bare PCB, a connection unit mounted on the bare PCB, and a plurality of probing apparatuses mounted on the bare PCB. Each of the probing apparatuses comprises a plurality of probing pins, a command decoding unit, a plurality of transmission switch elements, and a plurality of receiving switch elements. The connection unit is electrically connected with the plurality of probe points and transmits a plurality of interface signals to the plurality of probing apparatuses. The plurality of probing pins are electrically connected with the connection unit. The command decoding unit is manufactured with a mixed high-voltage IC process and receives the plurality of interface signals to control on/off statuses of the plurality of transmission switch elements and/or the plurality of receiving switch elements. The plurality of transmission switch elements are manufactured with the mixed high-voltage IC process and transmit the test signal to the corresponding probing pins in response to the control of the command decoding unit. The plurality of receiving switch elements are manufactured with the mixed high-voltage IC process and generates the probing result corresponding to the plurality of probing pins in response to the control of the command decoding unit.

Since the command decoding unit, the plurality of transmission switch elements and the plurality of receiving switch elements of the probing apparatus of the present invention are all manufactured with the mixed high-voltage IC process, the required pin numbers for the probing apparatus is reduced and the required area of the bare PCBs for the plurality of transmission switch elements and the plurality of receiving switch elements are reduced.

The detailed technology and preferred embodiments implemented for the subject invention are described in the following paragraphs accompanying the appended drawings for people skilled in this field to well appreciate the features of the claimed invention

DESCRIPTION OF THE PREFERRED EMBODIMENT

Figure 1A:
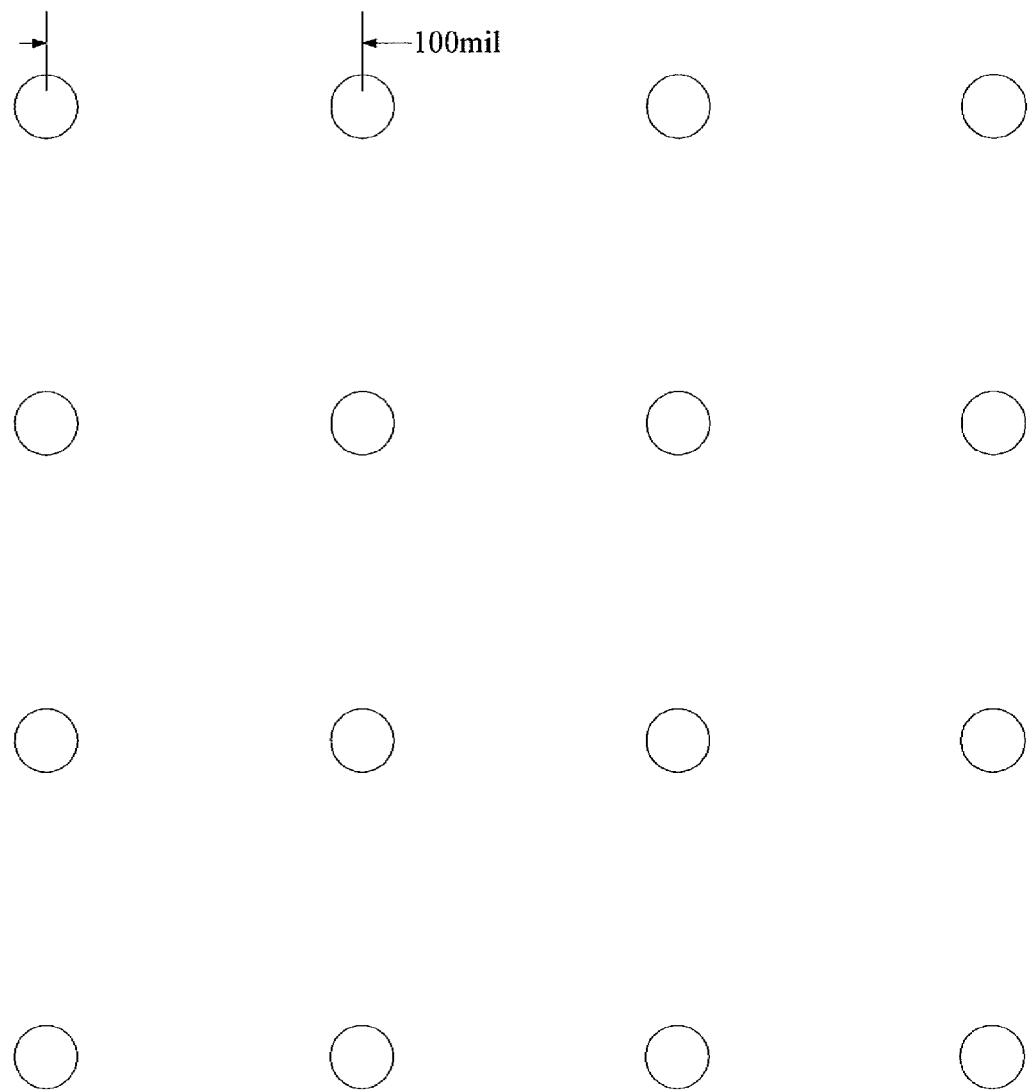
FIG. 1A is a diagram of a single-density probe point matrix of the prior art.
Figure 1B:
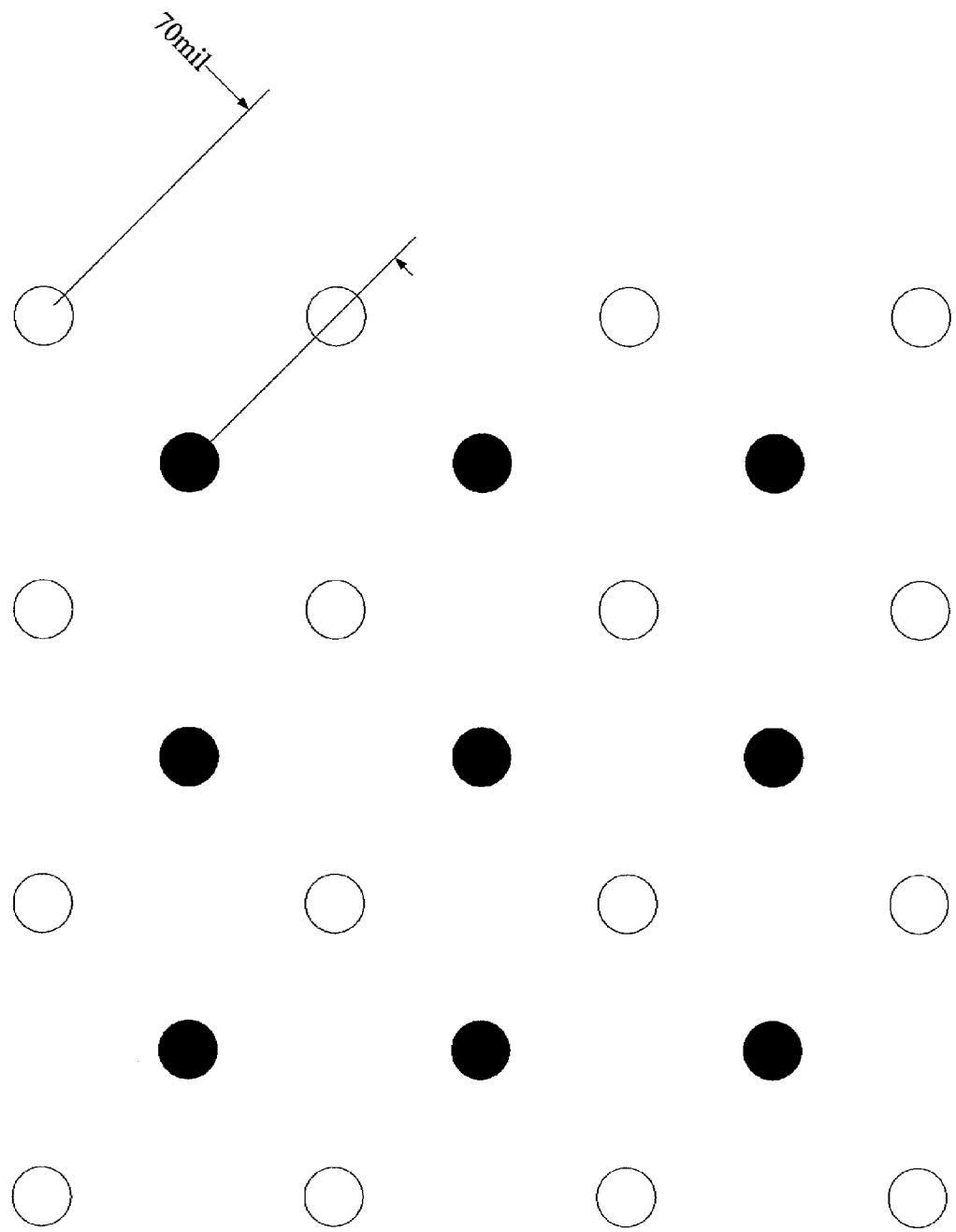
FIG. 1B is a diagram of a double-density probe point matrix of the prior art.
Figure 1C:
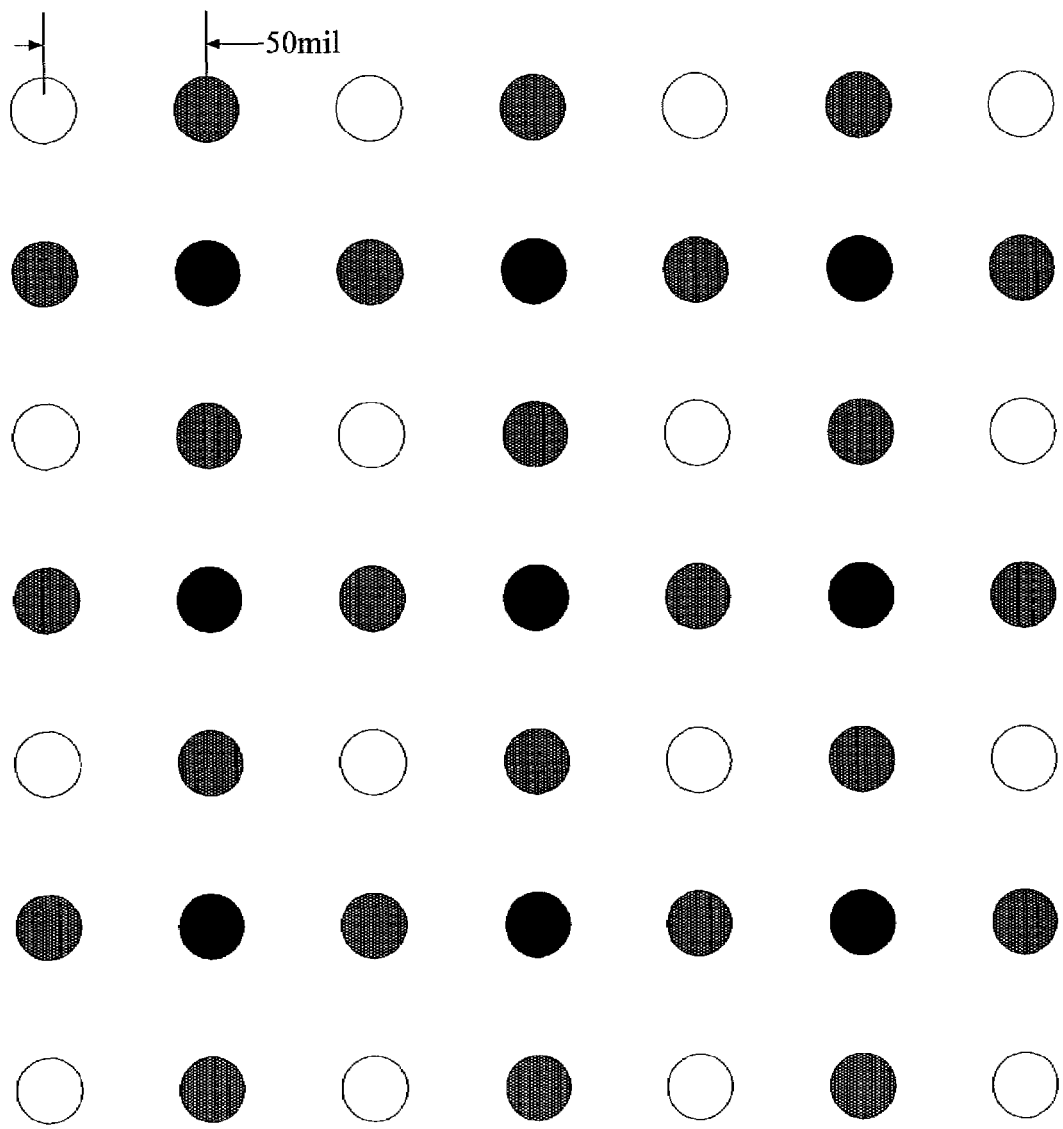
FIG. 1C is a diagram of a quad-density probe point matrix of the prior art.
Figure 1D:
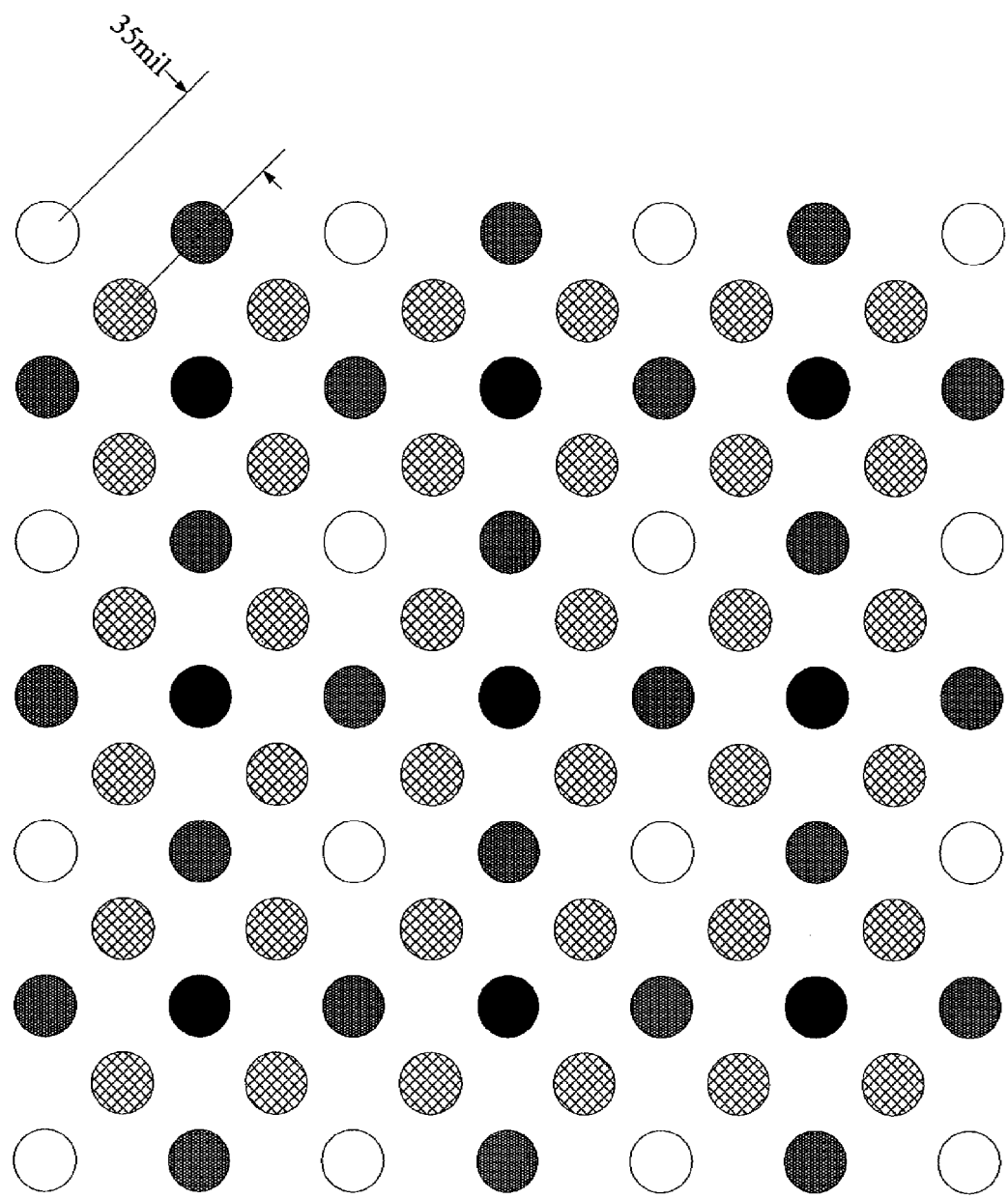
FIG. 1D is a diagram of a octuple-density probe point matrix of the prior art.
Figure 1E:
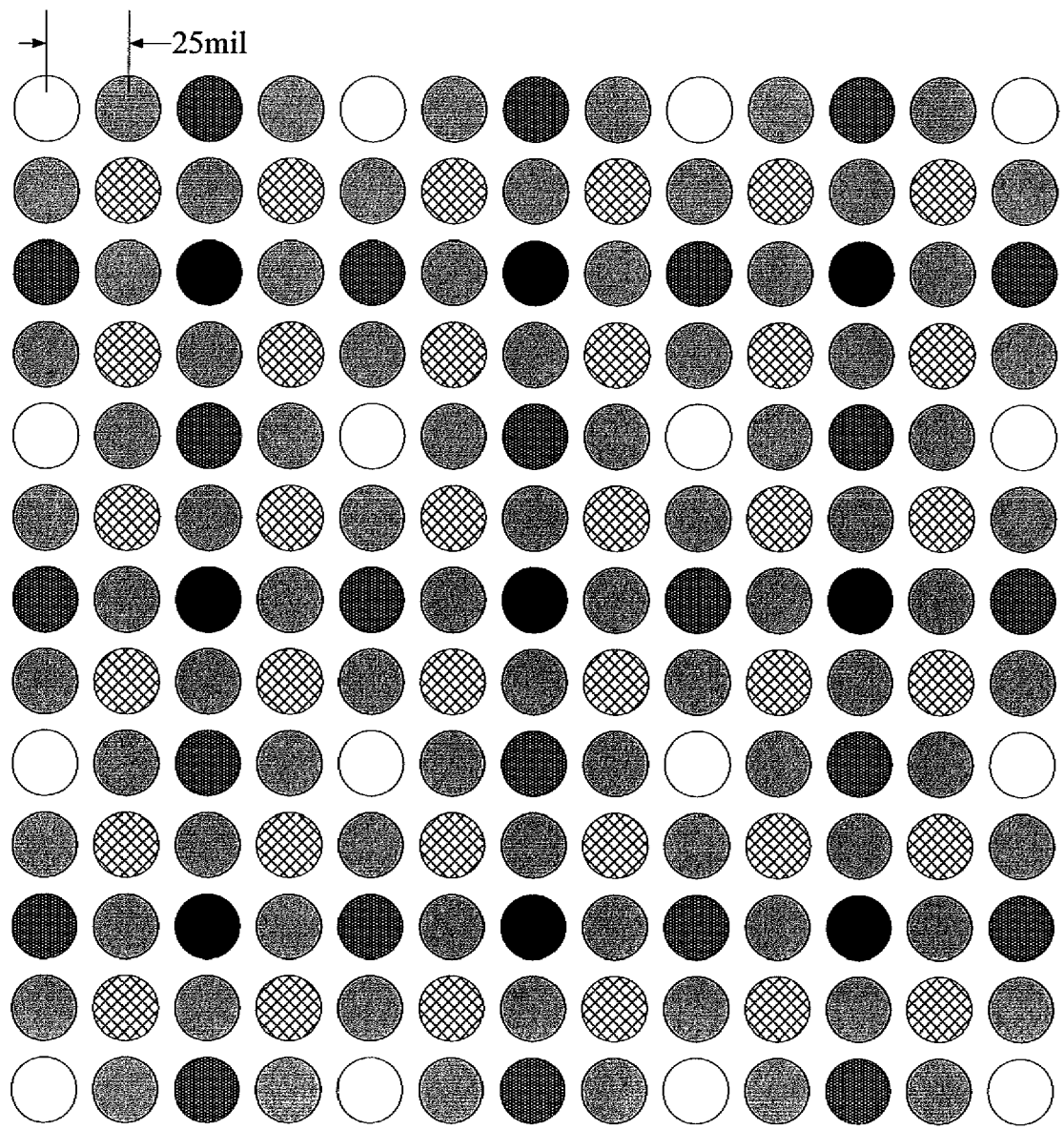
FIG. 1E is a diagram of a hexadecuple-density probe point matrix of the prior art.
Figure 2:
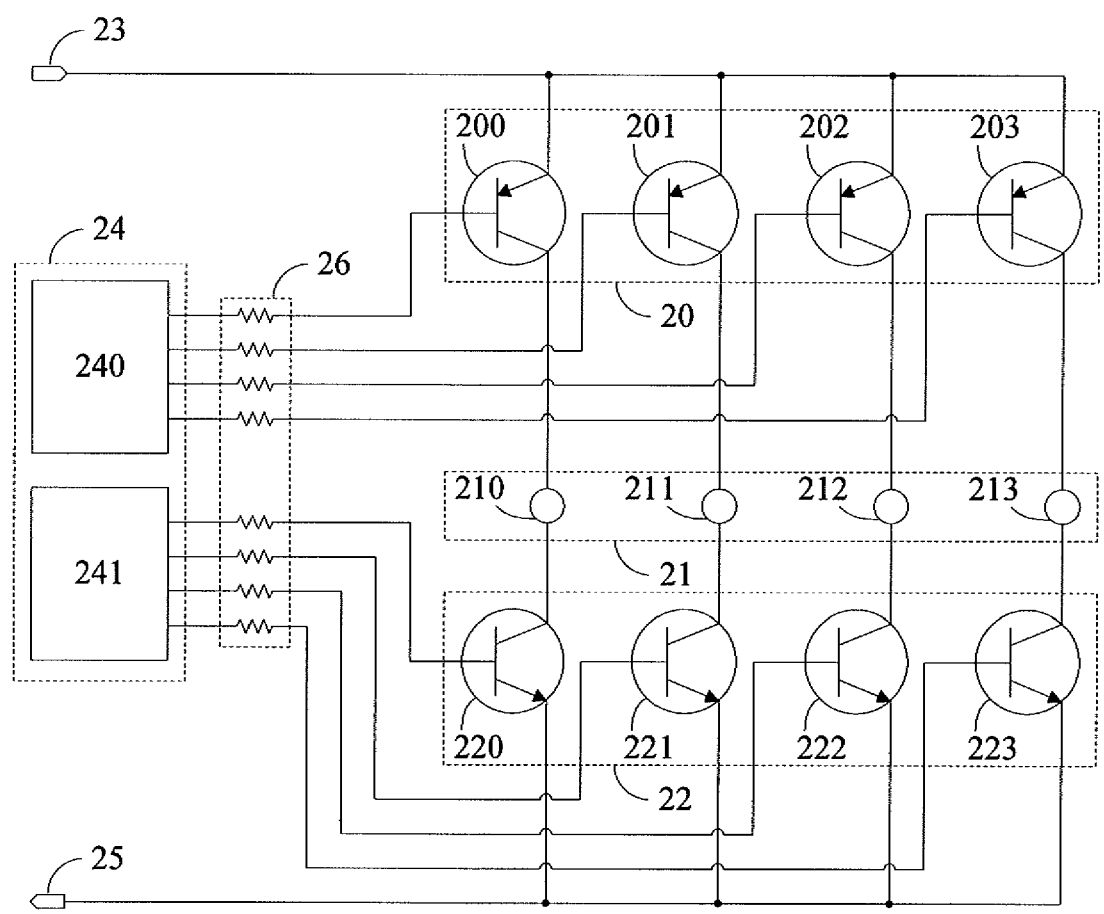
FIG. 2 is a diagram of a switching circuit of a bipolar transistor matrix of the prior art.
Figure 3:
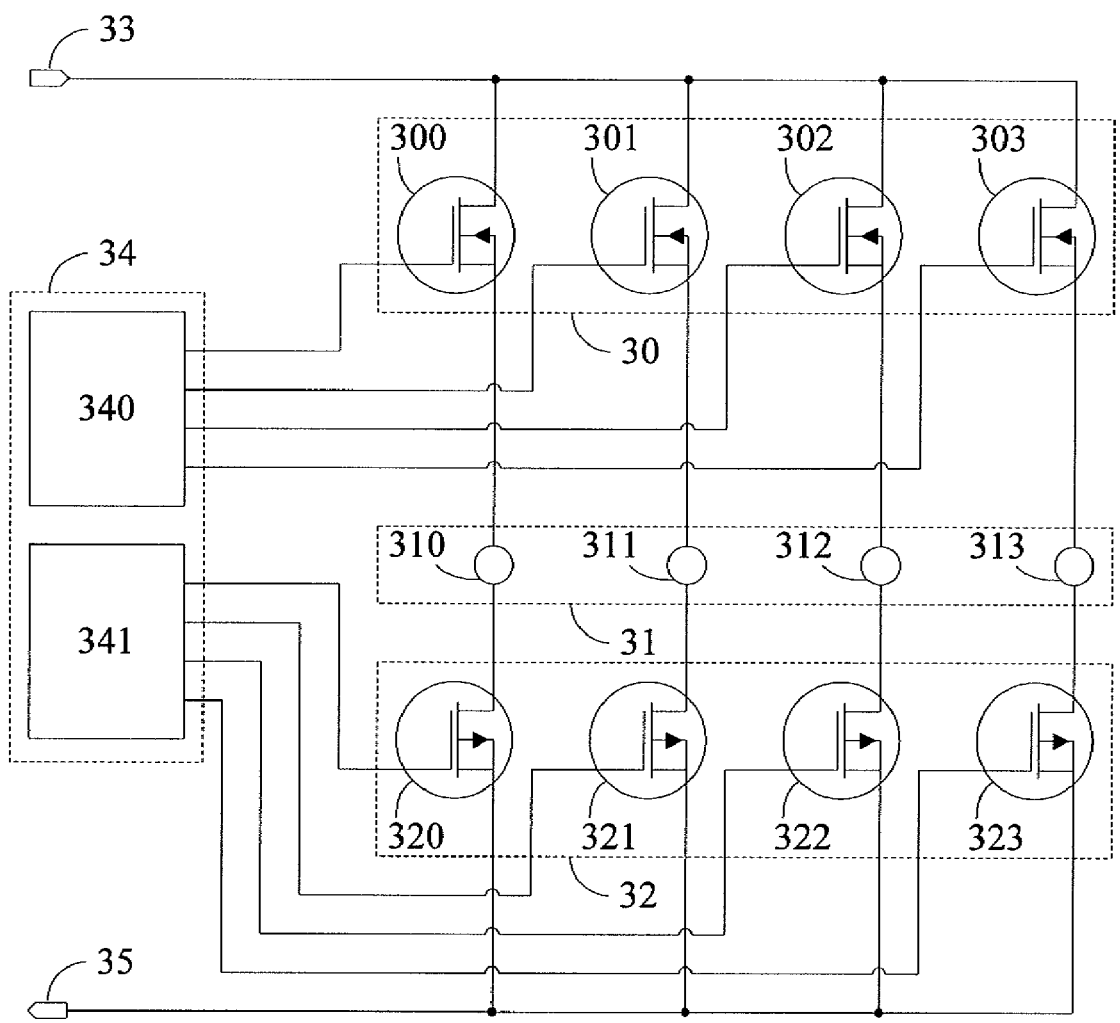
FIG. 3 is a diagram of a switching circuit of a field-effect-transistor matrix of the prior art.
Figure 4:
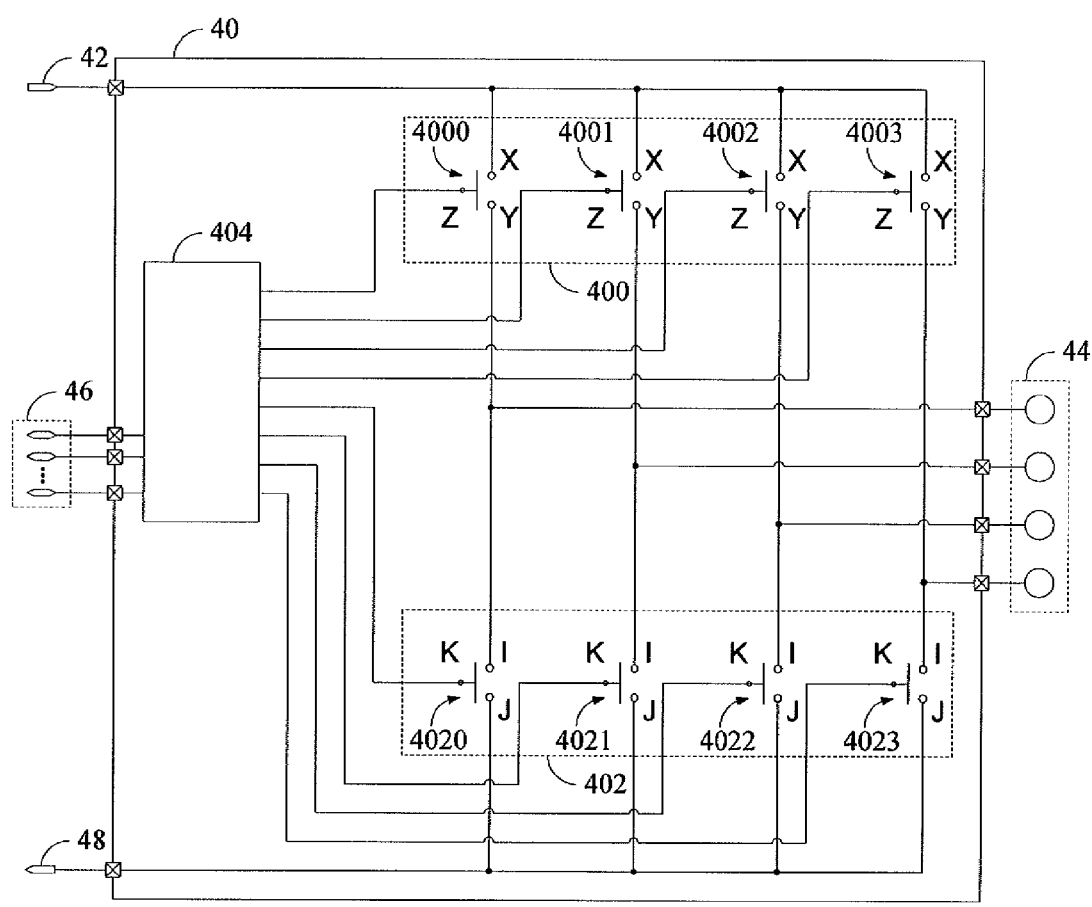
FIG. 4 is a diagram of a probing apparatus of a preferred embodiment of this invention.

FIG. 4 is a diagram of a probing apparatus of a preferred embodiment of this invention. The figure illustrates a probing apparatus 40, a test signal input port 42, a plurality of probe points 44, an interface signal connection port 46, and a probing result output port 48. The probing apparatus 40 can be a packaged chip. The test signal input port 42 can be a pin of the chip for transmitting a test signal generated by an external test signal generation unit (not shown), wherein the test signal can be a voltage signal within ±800 volts. The probing result output port 48 can be a pin of the chip for transmitting a probing result to an external verification unit (not shown) to determine a result. The probing result can be a signal voltage dropping after the test signal passes the equivalent resistance. The result can be a display output indicating either passing the test or failing the test. The plurality of probe points 44 electrically connects with the probing apparatus 40 through a plurality of probing pins. The interface signal connection port 46 is used for transmitting a plurality of interface signals. The interface signal connection port 46 can be a plurality of pins of the chip.

The probing apparatus 40 comprises a plurality of transmission switch elements 400, a plurality of receiving switch elements 402 and a command decoding unit 404. The plurality of transmission switch elements 400, manufactured with a mixed high-voltage IC process, comprises a first transmission switch element 4000, a second transmission switch element 4001, a third transmission switch element 4002, and a fourth transmission switch element 4003. Each of the transmission switch elements 4000-4003 has three connection points, comprising an input point X, an output point Y, and a control point Z, wherein the control point Z makes the input point X and the output point Y conducted in response to one of a plurality of switch control signals. The plurality of receiving switch elements 402, manufactured with a mixed high-voltage IC process, comprises a first receiving switch element 4020, a second receiving switch element 4021, a third receiving switch element 4022, and a fourth receiving switch element 4023. Each of the receiving switch elements 4020-4023 has three connection points which are an input point I, an output point J, and a control point K, wherein the control point K makes the input point I and the output point J conducted in response to one of the plurality of switch control signals.

The operations of the probing apparatus are described as follows. At first, the test signal is inputted to the input point X of each of the transmission switch elements 4000-4003. The interface signal connection port 46 transmits a command specifying which switch to be turned on or turned off to the command decoding unit 404. The command decoding unit 404, manufactured with the mixed high-voltage IC process, processes a transmission conversion on the plurality of interface signals. For example, the transmission protocol of the plurality of interface signals can be any serial transmission interfaces, such as RS-485, CAN, SPI, I2C, etc. in order to reduce the required number of pins of the probing apparatus 40. People skilled in the art can easily replace the transmission protocol for the plurality of interface signals according to practical requirements. After the plurality of interface signals are converted by the command decoding unit 404, a plurality of switch control signals are outputted to make the control point Z of each of the transmission switch elements 4000-4003 and/or the control point K of each of the receiving switch elements 4020-4023 operate in response to the plurality of switch control signals. The output point Y of each of the transmission switch elements 4000-4003 and the input point I of each of the receiving switch elements 4020-4023 are connected with the plurality of probe points 44 through the plurality of probing pins of the probing apparatus 40. Finally, the probe point result corresponding to one of the plurality of probe points 44 is transmitted through the output point J of the corresponding receiving switch element and the probing result output port 48 to the external verification unit for verifying the result. People skilled in the art can embed the external unit manufactured with the mixed high-voltage IC process in the probing apparatus 40 so that the probing result can be transmitted through the interface signal connection port 46.

Since the test signal may be a high-voltage signal or a high-current signal, the probing apparatus 40 of the first embodiment should be manufactured with a mixed high-voltage IC process, such as BCD, CD, or BiCMOS (Bipolar-CMOS) process. The plurality of transmission switch elements 400 and the plurality of receiving switch elements 402 are manufactured with a mid-high voltage IC process of the mixed high-voltage IC process. The mid-high voltage IC process can be a bipolar process or a DMOS process. The command decoding unit 404 is manufactured with a low-voltage IC process of the mixed high-voltage IC process. The low voltage IC process can be a CMOS process. Because of the mixed high-voltage IC process, logic devices, analog devices, and power devices can be integrated into a single IC process. Since integrating many high-voltage switch elements into a packaged chip may cause overheating problem, the chip can be packaged with better heat sink capability, such as a HiQUAD-64 with 64 pins or a HiQUAD-92 with 92 pins provided by the STMicroelectronics.

Figure 5:
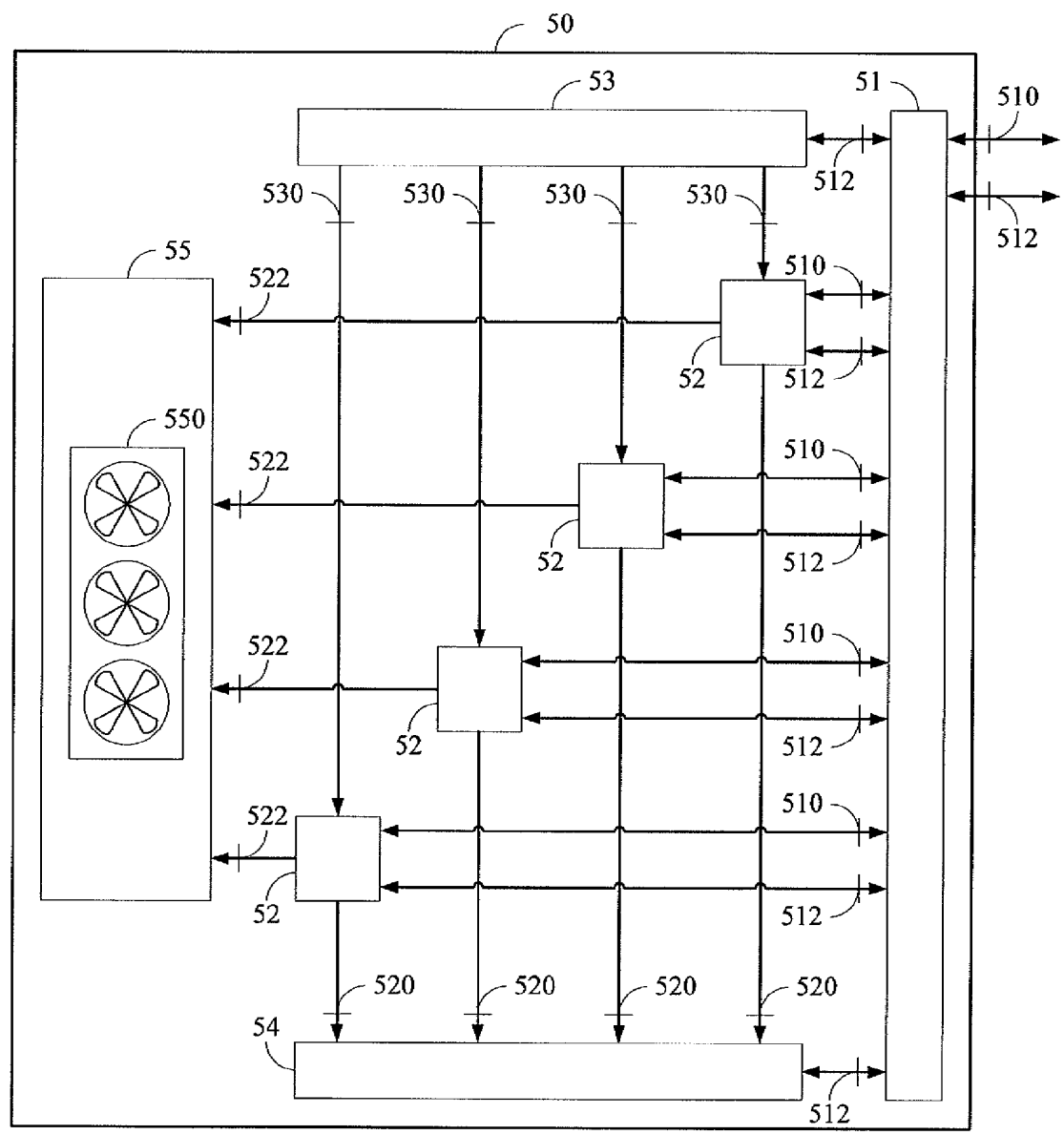
FIG. 5 is a diagram of a probing circuit board of a preferred embodiment of this invention.

FIG. 5 is a block diagram of a probing circuit board of a preferred embodiment of this invention. The probing circuit board comprises a bare circuit board 50, a connection unit 51, a plurality of probing apparatuses 52, a test signal generation unit 53, a verification unit 54, and a temperature control and heat sink unit 55, wherein the plurality of probing apparatuses 52 are similar to the probing apparatus 40 as shown in FIG. 4. The connection unit 51, the plurality of the probing apparatuses 52, the test signal generation unit 53, the verification unit 54, and the temperature control and heat sink unit 55 are mounted on the bare circuit board 50.

The connection unit 51 electrically connects a plurality of external probing signals 510 and a plurality of external interface signals 520 to the plurality of probing apparatuses 52. The connection unit 51 receives and transmits interface signals 512. The test signal generation unit 53 is responsible for generating a test signal 530 required by the plurality of probing apparatuses 52, wherein a feature of the test signal 530 can be controlled by the plurality of interface signals 512. The feature can be a voltage value, a current value, a test period, or the like. A probing result 520 of each of probing apparatuses 52 is determined by the verification unit 54 and a result after determination can be carried by the plurality of interface signals 512. The temperature control and heat sink unit 55 monitors operating temperatures of the plurality of probing apparatuses 52 by receiving temperature signals 522. When any of the temperature signals 522 reaches a predetermined alert value, a heat sink apparatus 550 of the temperature control and heat sink unit 55 is activated to reduce the operating temperature. The heat sink apparatus 550 can be one or more heat sink fans. People skilled in the art can implement the test signal generation unit 53 outside the probing circuit board and the test signal 530 can be transmitted to the plurality of probing apparatuses 52 through the connection unit 51. Similarly, the verification unit 54 can also be manufactured outside the probing circuit board and the probing results 520 of the plurality of probing apparatuses 52 can be delivered through the connection unit 51. The connection unit 51 can also be designed with a capability of delivering various transmission protocols and interface signals.

Since most of the switching circuits are integrated into and manufactured as the probing apparatus 40, the bare circuit board 50 has much more area for placing more probing apparatuses. If the probing apparatus 40 is manufactured as a chip with the HiQUAD-92 package, there are approximately 64 probing pins available, excluding the power and control pins. Assume that a package size of each HiQUAD-92 is 14 mm×20 mm=2.8 $cm^2$ and a size of each probing circuit board 50 is 28 cm×12 cm=336 $cm^2$. If 75% area of the bare circuit board 50 is available for placing the chips, each probing circuit board can contain approximately 90 chips of the probing apparatus 40 that provide 90×64=5,760 probe points. Consequently, it is much higher than the probing circuit boards of the prior art providing approximately 128 to 384 probe points.

Figure 6:
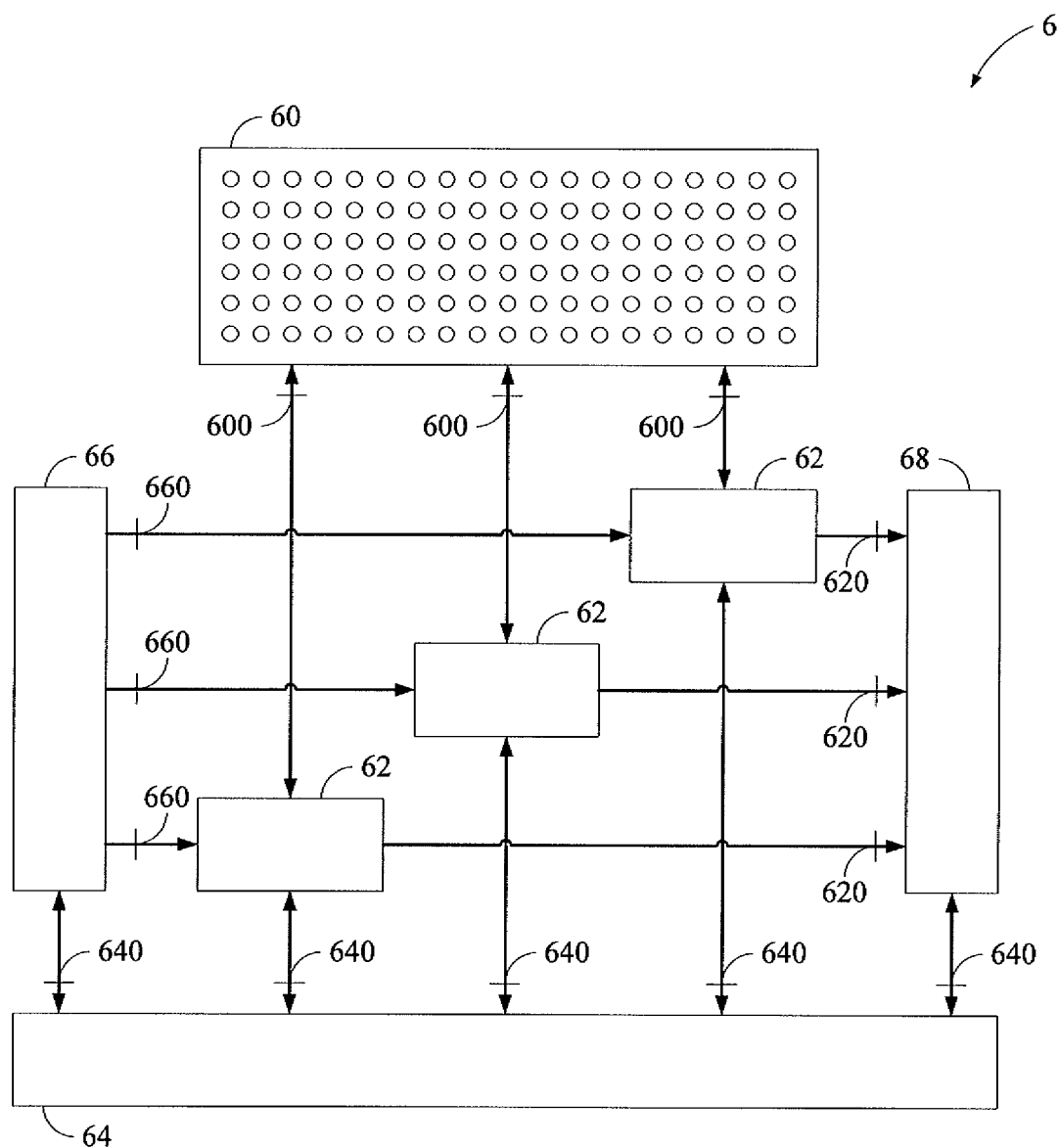
FIG. 6 is a diagram of a probing system of a preferred embodiment of this invention.

FIG. 6 is a block diagram of a probing system 6 of a preferred embodiment of this invention. The probing system 6 comprises a plurality of probe points 60, a plurality of probing circuit board 62, a control unit 64, a test signal generation unit 66, and a verification unit 68. The probing system 6 probes an electrically connected object under test by test signals 660 and generates probing results 620. The plurality of probe points 60 are connected with the object under test. Each of the probing circuit boards 62 is the probing circuit board shown in FIG. 5. The plurality of probe points 60 connect with the plurality of probing circuit boards 62 through a plurality of probing signals 600. The control unit 64 generates a plurality of interface signals 640. The control unit 64 can be an embedded system, a control interface card, or a computer. The test signal generation unit 66 can be operated under the control of the control unit 64 through the plurality of interface signals 640 to generate the test signal 660 for the plurality of probing circuit boards 62, wherein a controllable feature for the test signal 660 can be a voltage value, a current value, a test period, or the like. The verification unit 68 is used for determining the probing results 620 outputted by the plurality of probing circuit boards 62. The verification unit 68 can transmit a determination result to the control unit 64 through the plurality of interface signals 640. People skilled in the art can easily implement the test signal generation unit 64 and/or the verification unit 68 within each of the probing circuit boards 62.

If each probing circuit board of the present invention provides 5,760 probe points as shown in FIG. 5, it only requires approximately 35 pieces of the probing circuit boards to provide a total number of two hundred thousand probe points.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A probing apparatus for high-voltage matrix probing, the probing apparatus, electrically connected with a plurality of probe points and a plurality of interface signals, receiving a test signal and generating a probing result, the probing apparatus comprising:
   a plurality of probing pins;
   a command decoding unit manufactured with a mixed high-voltage IC process;
   a plurality of transmission switch elements manufactured with the mixed high-voltage IC process; and
   a plurality of receiving switch elements manufactured with the mixed high-voltage IC process;
   wherein the plurality of probing pins are electrically connected with the plurality of probe points, the command decoding unit is electrically connected with the plurality of interface ports and controls on/off statuses of the plurality of transmission switch elements and/or the plurality of receiving switch elements, the plurality of transmission switch elements transmit the test signal to the corresponding probing pins in response to the command decoding unit, and the plurality of receiving switch elements generate the probing result corresponding to the corresponding probing pins in response to the command decoding unit.

2. The probing apparatus as claimed in claim 1, wherein the command decoding unit is manufactured with a low-voltage IC process of the mixed high-voltage IC process.

3. The probing apparatus as claimed in claim 2, wherein the low-voltage IC process is a CMOS process.

4. The probing apparatus as claimed in claim 1, wherein the plurality of transmission switch elements and the plurality of receiving switch elements are manufactured with a medium-high voltage IC process of the mixed high-voltage IC process.

5. The probing apparatus as claimed in claim 4, wherein the medium-high voltage IC process is a bipolar transistor process.

6. The probing apparatus as claimed in claim 4, wherein the medium-high voltage IC process is a DMOS process.

7. The probing apparatus as claimed in claim 1, wherein an acceptable voltage range of the plurality of transmission switch elements and the plurality of receiving switch elements is within ±800 volts.

8. The probing apparatus as claimed in claim 1, further comprising a verification unit, manufactured with the mixed high-voltage IC process, for verifying the probing result and transmitting the probing result out.

9. A probing circuit board for high-voltage matrix probing, the probing circuit board, electrically connected with a plurality of probe points and a plurality of interface signals, receiving a test signal and generating a probing result, the probing circuit board comprising:
   a bare printed circuit board;
   a connection unit mounted on the bare printed circuit board; and
   a plurality of probing apparatuses mounted on the bare printed circuit board, each of the probing apparatuses comprising a plurality of probing pins, a command decoding unit, a plurality of transmission switch elements, and a plurality of receiving switch elements;
   wherein the connection unit electrically connects the plurality of probe points and the plurality of interface ports with the plurality of probing apparatuses, the plurality of probing pins are electrically connected with the connection unit, the command decoding unit is manufactured with a mixed high-voltage IC process and electrically connected with the plurality of interface ports and controls on/off statuses of the plurality of transmission switch elements and/or the plurality of receiving switch elements, the plurality of transmission switch elements are manufactured with the mixed high-voltage IC process and transmit the test signal to the corresponding probing pins in response to the control of the command decoding unit, and the plurality of receiving switch elements are manufactured with the mixed high-voltage IC process and generate the probing result corresponding to the plurality of probing pins in response to the control of the command decoding unit.

10. The probing circuit board as claimed in claim 9, wherein the command decoding unit is manufactured with a low-voltage IC process of the mixed high-voltage IC process.

11. The probing circuit board as claimed in claim 10, wherein the low-voltage IC process is a CMOS process.

12. The probing circuit board as claimed in claim 9, wherein the plurality of transmission switch elements and the plurality of receiving switch elements are manufactured with a medium-high voltage IC process of the mixed high-voltage IC process.

13. The probing circuit board as claimed in claim 12, wherein the medium-high voltage IC process is a bipolar transistor process.

14. The probing circuit board as claimed in claim 12, wherein the medium-high voltage IC process is a DMOS process.

15. The probing circuit board as claimed in claim 9, wherein an acceptable voltage range of the plurality of transmission switch elements and the plurality of receiving switch elements is within ±800 volts.

16. The probing circuit board as claimed in claim 9, wherein the probing apparatus further comprising a verification unit manufactured with the mixed high-voltage IC process for verifying the probing result and transmitting the probing result out.

17. The probing circuit board as claimed in claim 9, further comprising a test signal generation unit for generating the test signal.

18. The probing circuit board as claimed in claim 9, further comprising a verification unit for verifying the probing result.

19. The probing circuit board as claimed in claim 9, further comprising a temperature control and heat sink unit for monitoring an operating temperature of the plurality of probing apparatuses and for decreasing the operating temperature while the operating temperature reaches a predetermined alert level.

20. A probing system for high-voltage matrix probing, the probing system probing an electrically connected object with a test signal and generating a probing result, the probing system comprising:
- a plurality of probe points electrically connected with the object;
- a control unit for generating a plurality of interface signals and receiving the probing result; and
- a plurality of probing circuit boards, each of the probing circuit boards comprising:
  - a bare printed circuit board;
  - a connection unit mounted on the bare printed circuit board; and
  - a plurality of probing apparatuses mounted on the bare printed circuit board, each of the probing apparatuses comprising a plurality of probing pins, a command decoding unit, a plurality of transmission switch elements and a plurality of receiving switch elements;
- wherein the connection unit is electrically connected with the plurality of probe points and transmits a plurality of interface signals to the plurality of probing apparatuses, the plurality of probing pins are electrically connected with the connection unit, the command decoding unit is manufactured with a mixed high-voltage IC process and receives the plurality of interface signals to control on/off statuses of the plurality of transmission switch elements and/or the plurality of receiving switch elements, the plurality of transmission switch elements are manufactured with the mixed high-voltage IC process and transmit the test signal to the corresponding probing pins in response to the control of the command decoding unit, and the plurality of receiving switch elements are manufactured with the mixed high-voltage IC process and generate the probing result corresponding to the plurality of probing pins in response to the control of the command decoding unit.

21. The probing system as claimed in claim 20, wherein the command decoding unit is manufactured with a low-voltage IC process of the mixed high-voltage IC process.

22. The probing system as claimed in claim 21, wherein the low-voltage IC process is a CMOS process.

23. The probing system as claimed in claim 20, wherein the plurality of transmission switch elements and the plurality of receiving switch elements are manufactured with a medium-high voltage IC process of the mixed high-voltage IC process.

24. The probing system as claimed in claim 23, wherein the medium-high voltage IC process is a bipolar transistor process.

25. The probing system as claimed in claim 23, wherein the medium-high voltage IC process is a DMOS process.

26. The probing system as claimed in claim 20, wherein an acceptable voltage range of the plurality of transmission switch elements and the plurality of receiving switch elements is within ±800 volts.

27. The probing system as claimed in claim 20, wherein the probing apparatus further comprises a verification unit, manufactured with the mixed high-voltage IC process, for verifying the probing result and transmitting the probing result out.

28. The probing system as claimed in claim 20, wherein the probing circuit board further comprises a test signal generation unit for generating the test signal.

29. The probing system as claimed in claim 20, wherein the probing circuit board further comprises a verification unit for verifying the probing result.

30. The probing system as claimed in claim 20, wherein the probing circuit board further comprises a temperature control and heat sink unit for monitoring an operating temperature of the plurality of probing apparatuses and for decreasing the operating temperature while the operating temperature reaches a predetermined alert level.

31. The probing system as claimed in claim 20, further comprising a test signal generation unit for generating the test signal.

32. The probing system as claimed in claim 20, further comprising a verification unit for verifying the probing result.

* * * * *